(12) United States Patent
Rapoport et al.

(10) Patent No.: US 7,297,907 B2
(45) Date of Patent: Nov. 20, 2007

(54) MEANS AND METHOD OF MAINTAINING A CONSTANT TEMPERATURE IN THE MAGNETIC ASSEMBLY OF A MAGNETIC RESONANCE DEVICE

(76) Inventors: Uri Rapoport, 17, Moshav Ben Shemen 73115 (IL); Ehud Katznelson, 18B Hayasmin St., Ramat Yishay 30095 (IL)

( * ) Notice: Subject to any disclaimer, the term of this patent is extended or adjusted under 35 U.S.C. 154(b) by 0 days.

(21) Appl. No.: 11/296,865

(22) Filed: Dec. 8, 2005

(65) Prior Publication Data

US 2007/0131673 A1    Jun. 14, 2007

(51) Int. Cl.
*H05B 1/02* (2006.01)
(52) U.S. Cl. ............... 219/497; 219/496; 219/505; 324/322; 62/50.7; 600/412
(58) Field of Classification Search ............... 219/497, 219/499, 501, 494, 508, 496; 324/315–318, 324/322, 320; 600/410–425; 165/206; 62/50.7, 62/259.2, 51.1
See application file for complete search history.

(56) References Cited

U.S. PATENT DOCUMENTS

| | | | |
|---|---|---|---|
| 6,354,087 B1 * | 3/2002 | Nakahara et al. | 62/6 |
| 6,906,517 B1 * | 6/2005 | Huang et al. | 324/315 |
| 2002/0073717 A1 * | 6/2002 | Dean et al. | 62/50.7 |
| 2002/0148604 A1 * | 10/2002 | Emeric et al. | 165/206 |
| 2005/0030028 A1 * | 2/2005 | Clarke et al. | 324/318 |
| 2005/0035764 A1 * | 2/2005 | Mantone et al. | 324/318 |

* cited by examiner

*Primary Examiner*—Mark Paschall
(74) *Attorney, Agent, or Firm*—Daniel J. Swirsky; AlphaPatent Associates Ltd.

(57) ABSTRACT

The present invention discloses a novel active insulation device and method for thermally shielding an external body from temperature fluctuations of a contained body. The method comprising providing an active thermal insulation envelope between the contained body and the external body; regulating the heat transfer from the active thermal insulation envelope to the external body; and regulating the heat transfer from the contained body to the active thermal insulation envelope, thus maintaining the temperature of the external body at a constant temperature or within a narrow temperature range.

6 Claims, 3 Drawing Sheets

MEANS AND METHOD OF MAINTAINING A CONSTANT TEMPERATURE IN THE MAGNETIC ASSEMBLY OF A MAGNETIC RESONANCE DEVICE

FIELD OF INVENTION

The present invention generally relates to a means and method of maintaining a constant temperature in the magnetic assembly of a magnetic resonance device.

BACKGROUND OF THE INVENTION

A magnetic resonance imaging device produces a measurement of a sample which is based upon its molecular structure. The sample is subjected to a polarizing magnetic field which has the effect of aligning the spins of all the atomic nuclei of the sample. Radio waves at a frequency close to the Lamor frequency of the nuclei are then used to excite the nuclei such that their magnetic alignment is reversed. Once the excitation is removed the nuclei return to their original state by emitting characteristic radio signals. It is these radio signals that can be used to image the sample.

The exact Lamor frequency is dependent upon the precise magnetic field. By creating a magnetic field gradient within the sample cavity the source of these signals can be located such that an overall image of the sample can be constructed.

The efficiency of this process depends upon the consistency of the magnetic field strength within the sample cavity. This field is typically controlled to within 5 parts per million. The extent of the uniformity of the magnetic field determines the accuracy with which the Lamor frequency can be measured. This allows for the resolution of smaller chemical shifts.

The magnetic field is dependent to a large extent upon the ferromagnetic properties of the materials making up its magnetic assembly. These ferromagnetic characteristics are often temperature dependent and so it is important to maintain the magnetic assembly at a constant temperature. This can be particularly problematic where the temperature of the sample being imaged is itself fluctuating. In such a scenario it is necessary to introduce a means of insulating the magnetic assembly from the magnetic assembly.

Passive insulation is insufficient to stabilize a sensitive permanent-magnet magnetic resonance system. This is due to the nature of permanent magnet material that has a sensitive temperature coefficient that causes the magnetic field of the system to fluctuate beyond an acceptable range. There is thus a long felt need in the art for a means and method of maintaining a constant temperature in the magnetic assembly of a magnetic resonance device.

SUMMARY OF THE INVENTION

It is according to one embodiment of the current invention to present, in a magnetic resonance device, an active insulation method for thermally shielding an external body from temperature fluctuations of a contained body. This method comprises, providing an active thermal insulation envelope between the contained body and the external body, regulating the heat transfer from the active thermal insulation envelope to the external body and regulating the heat transfer from the contained body to the active thermal insulation envelope. Thus the temperature of the external body is maintained at a constant temperature or within a narrow temperature range.

It is according to a preferred embodiment of the current invention to present, in a magnetic resonance device, an active insulation method additionally providing: a closed circuit of shielding fluid such as a CFC mixture; a means of controlling the flow rate of said shielding fluid around the circuit, such as inter alia a pump; and a means, such as inter alia a heat exchanger, of controlling the temperature of said shielding fluid around the circuit. The method then comprises monitoring the temperature of the shielding fluid by means of a temperature gauge; the temperature of the contained body; the temperature of the external body; and the flow rate of the shielding fluid using a flow meter or any other means. A controlling means, such as inter alia a CPU mixture, is provided which receives data from the flow meters and temperature gauges, processes the data and sends control signals to the pump or the heat exchanger, thereby controlling the amount of heat flowing between the active thermal insulation envelope and the contained body as well as the amount of heat flowing between the active thermal insulation envelope and the external body.

It is according to another embodiment of the current invention to present, in a magnetic resonance device, an active insulation method by controlling the heat flowing from the active thermal insulation envelope to the external body by increasing the flow rate of the shielding fluid, using a pump or any other means, when the temperature of the contained body increases and reducing the flow rate of the shielding fluid when the temperature of the contained body decreases.

It is according to another embodiment of the current invention to present, in a magnetic resonance device, an active insulation method by controlling the heat of flowing from the active thermal insulation envelope to the external body by increasing the temperature of the shielding fluid, by means of a heat exchanger or any other means, when the temperature of the contained body decreases and decreasing the temperature of the shielding fluid, by means of a heat exchanger or any other means, when the temperature of the contained body increases.

It is according to another embodiment of the current invention to present, in a magnetic resonance device, an active insulation method by controlling the heat of flowing from the active thermal insulation envelope to the external body by a combination of adjusting the temperature of the shielding fluid and its flow rate in response to changes in the temperature of either the contained body, external body or both.

It is according to a further embodiment of the current invention to present, in a magnetic resonance device, an active insulation means for thermally shielding an external body from temperature fluctuations of a contained body comprising: an active thermal insulation envelope between the contained body and the external body; a means of regulating the heat transfer from the active thermal insulation envelope to the external body and a means of regulating the heat transfer from the contained body to the active thermal insulation envelope; such that the temperature of the external body is maintained at a constant temperature or within a narrow temperature range.

It is according to a preferred embodiment of the current invention to present, in a magnetic resonance device, an active insulation means for thermally shielding an external body from temperature fluctuations of a contained body, additionally comprising: at least one closed circuit containing a shielding fluid such as inter alia a CFC mixture; at least one pump or any other means of controlling the flow rate of said shielding fluid around the circuit; at least one heat exchanger or any other means of controlling the temperature of said shielding fluid around the circuit; at least one means, such as inter alia a temperature gauge, thermometer, thermocouple, of measuring the temperature of the shielding fluid; at least one means, such as inter alia a temperature gauge, thermometer or thermocouple, of measuring the temperature of the contained body; at least one means, such as inter alia a temperature gauge, thermometer, thermocouple, of measuring the temperature of the external body; at least one means, such as inter alia a flow meter, of measuring the flow rate of the shielding fluid; and a controlling means, such as inter alia a CPU, which receives data from the flow meters and temperature gauges, processes the data and sends control signals to the pump or the heat exchanger; such that the amount of heat flowing between the active thermal insulation envelope and the contained body as well as the amount of heat flowing between the active thermal insulation envelope and the external body is controlled.

It is according to a further embodiment of the current invention to present, in a magnetic resonance device, an active insulation means for thermally shielding an external body from temperature fluctuations of a contained body wherein the external body is the magnetic assembly of a magnetic resonance measuring device, such as inter alia, an NMR or MRI, and the contained body is a sample being measured by said magnetic resonance measuring device.

BRIEF DESCRIPTION OF THE FIGURES

In order to understand the invention and to see how it may be implemented in practice, few preferred embodiments will now be described, by way of non-limiting example only, with reference to the accompanying drawing, in which.

DETAILED DESCRIPTION OF THE EMBODIMENTS

Figure 1:
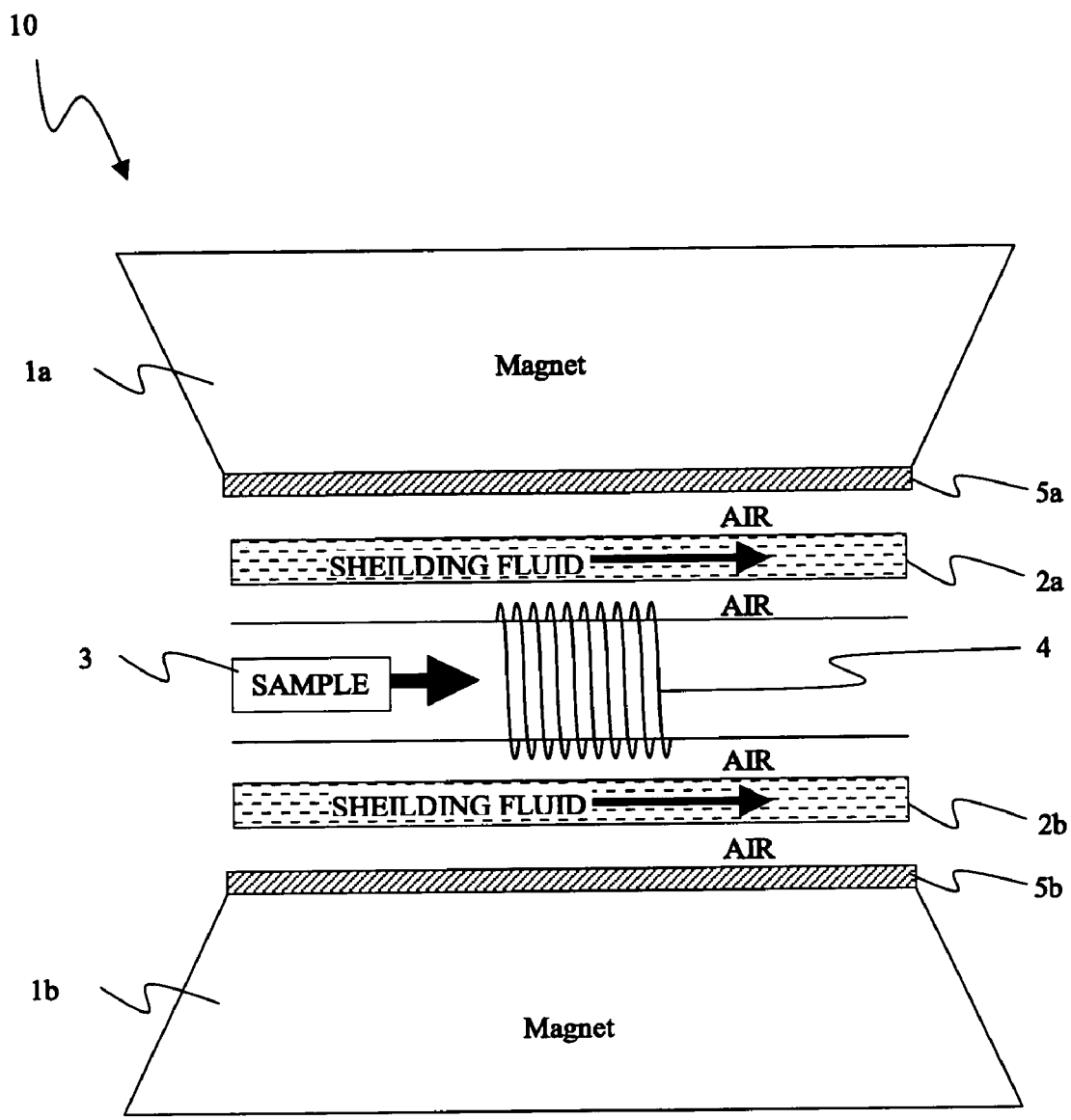
FIG. 1 schematically represents the magnetic resonance device in cross section showing the position of the sample within an insulating envelope containing the shielding fluid.

The following description is provided, alongside all chapters of the present invention, so as to enable any person skilled in the art to make use of said invention and sets forth the best modes contemplated by the inventor of carrying out this invention. Various modifications, however, will remain apparent to those skilled in the art, since the generic principles of the present invention have been defined specifically to a means and method of maintaining a constant temperature in the magnetic assembly of a magnetic resonance device.

The term 'magnetic resonance device' applies hereinafter to a device such as an NMR, ESR (EPR), NQR or MRI device, adapted to measure the radio signals emitted from the nuclei of the atoms within a sample when said nuclei are excited by electromagnetic radiation.

The term 'active thermal insulation' applies hereinafter to any active means of maintaining a constant temperature difference across the boundary between two bodies. Examples include, inter alia, closed circuits of shielding fluid, peltier device, layers of heating materials and monitoring sensors or any other means.

The term 'thermal shield' applies hereinafter to a body introduced between two or more others in order to prevent thermal transfer from one side to the other.

The term 'closed circuit' applies hereinafter to a passage through which a fluid is free to move in a given path but is unable to escape from the circuit.

The term 'shielding fluid' applies hereinafter to a fluid contained within a thermal shield particularly where said shield forms a section of a closed circuit.

The term 'plurality' applies hereinafter to any integer greater than or equal to one.

The term 'magnetic assembly' applies hereinafter to the assembly providing the magnetic field in the field of view of a magnetic resonance measurement device. The magnetic assembly is selected from a plurality of pole pieces, side wall magnets, passive insulation layers, active and passive shimming mechanism, gradient coils or any combination thereof.

The term 'shimming mechanism' applies hereinafter to any mechanism for correcting the inhomogeneities of a magnetic field due to imperfections in the magnet or the presence of external ferromagnetic objects. A shimming mechanism may include, inter alia, passive shimming elements, active shimming elements, feedback controlled shimming, CPU controlled shimming, superconducting shimming elements.

The term 'shim coils' or "active shimming elements" applies hereinafter to coils positioned around the magnets in order to correct any inhomogeneities of the magnetic field.

The term 'passive shimming elements' applies hereinafter to pieces of ferromagnetic material positioned around the magnets in order to correct inhomogeneities of the magnetic field.

The term 'gradient coil' applies hereinafter to a coil used to create a magnetic gradient over at least a portion of the sample cavity.

The term 'pole piece' applies hereinafter to an element of high permeability material used to shape the uniformity of the magnetic flux from a permanent magnet. In one such example a pole piece is constructed from small granules of ferromagnetic material, the diameter of each granule is of the order of one micron. Said granules are embedded within a plastic coating which serves to strengthen the granules and prevent distortion of their shapes. The material is cut into small cubes which are stuck together with non-conducting glue and with spacers between the granules. Such a construction prevents the formation of large eddy currents within the pole piece, thereby increasing the efficiency of the magnet.

The term 'side wall magnets' applies hereinafter to permanent magnets arranged around the sides of pole pieces that maintain the uniformity of the magnetic field from the permanent magnet.

It is according to one embodiment of the current invention to present, in a magnetic resonance device, an active insulation method for thermally shielding an external body from temperature fluctuations of a contained body. This method comprises, providing an active thermal insulation envelope between the contained body and the external body, regulating the heat transfer from the active thermal insulation envelope to the external body and regulating the heat transfer from the contained body to the active thermal insulation envelope. Thus the temperature of the external body is maintained at a constant temperature or within a narrow temperature range.

It is according to a preferred embodiment of the current invention to present, in a magnetic resonance device, an active insulation method additionally providing: a closed circuit of shielding fluid such as a CFC mixture; a means of controlling the flow rate of said shielding fluid around the circuit, such as inter alia a pump; and a means, such as inter alia a heat exchanger, of controlling the temperature of said shielding fluid around the circuit. The method then comprises monitoring the temperature of the shielding fluid by means of a temperature gauge; the temperature of the contained body; the temperature of the external body; and the flow rate of the shielding fluid using a flow meter or any other means. A controlling means, such as inter alia a CPU mixture, is provided which receives data from the flow meters and temperature gauges, processes the data and sends control signals to the pump or the heat exchanger, thereby controlling the amount of heat flowing between the active thermal insulation envelope and the contained body as well as the amount of heat flowing between the active thermal insulation envelope and the external body.

It is according to another embodiment of the current invention to present, in a magnetic resonance device, an active insulation method by controlling the heat flowing from the active thermal insulation envelope to the external body by increasing the flow rate of the shielding fluid, using a pump or any other means, when the temperature of the contained body increases and reducing the flow rate of the shielding fluid when the temperature of the contained body decreases.

It is according to another embodiment of the current invention to present, in a magnetic resonance device, an active insulation method by controlling the heat of flowing from the active thermal insulation envelope to the external body by increasing the temperature of the shielding fluid, by means of a heat exchanger or any other means, when the temperature of the contained body decreases and decreasing the temperature of the shielding fluid, by means of a heat exchanger or any other means, when the temperature of the contained body increases.

It is according to another embodiment of the current invention to present, in a magnetic resonance device, an active insulation method by controlling the heat of flowing from the active thermal insulation envelope to the external body by a combination of adjusting the temperature of the shielding fluid and its flow rate in response to changes in the temperature of either the contained body, external body or both.

It is according to a further embodiment of the current invention to present, in a magnetic resonance device, an active insulation means for thermally shielding an external body from temperature fluctuations of a contained body comprising: an active thermal insulation envelope between the contained body and the external body; a means of regulating the heat transfer from the active thermal insulation envelope to the external body and a means of regulating the heat transfer from the contained body to the active thermal insulation envelope; such that the temperature of the external body is maintained at a constant temperature or within a narrow temperature range.

It is according to a preferred embodiment of the current invention to present, in a magnetic resonance device, an active insulation means for thermally shielding an external body from temperature fluctuations of a contained body, additionally comprising: at least one closed circuit containing a shielding fluid such as inter alia a CFC mixture; at least one pump or any other means of controlling the flow rate of said shielding fluid around the circuit; at least one heat exchanger or any other means of controlling the temperature of said shielding fluid around the circuit; at least one means, such as inter alia a temperature gauge, thermometer, thermocouple, of measuring the temperature of the shielding fluid; at least one means, such as inter alia a temperature gauge, thermometer or thermocouple, of measuring the temperature of the contained body; at least one means, such as inter alia a temperature gauge, thermometer, thermocouple, of measuring the temperature of the external body; at least one means, such as inter alia a flow meter, of measuring the flow rate of the shielding fluid; and a controlling means, such as inter alia a CPU, which receives data from the flow meters and temperature gauges, processes the data and sends control signals to the pump or the heat exchanger; such that the amount of heat flowing between the active thermal insulation envelope and the contained body as well as the amount of heat flowing between the active thermal insulation envelope and the external body is controlled.

It is according to a further embodiment of the current invention to present, in a magnetic resonance device, an active insulation means for thermally shielding an external body from temperature fluctuations of a contained body wherein the external body is the magnetic assembly of a magnetic resonance measuring device, such as inter alia, an NMR or MRI, and the contained body is a sample being measured by said magnetic resonance measuring device.

The following example will clarify the concept. Heater 25 heats the shielding fluid, to a predetermined temperature as it enters the magnet. That temperature should be a couple degrees above the maximum temperature allowed for the sample that flows through the NMR probe (referred to as the "tested material"). As the tested material flows through the NMR probe, it releases energy via conductivity or reflection and causes the shielding fluid to rise in temperature, but because the shielding fluid is flowing, the layers of the liquid close to the tested material carries this energy out of the magnet cavity and into the heat exchanger where the temperature of the shielding fluid is reduced below the temperature of the tested material. As the flow of the shielding fluid continues in the loop, it goes again through the heater to bring the temperature back to the predetermined temperature in order to assure that the temperature of the layer that comes in contact with the magnet or the insulating layer will be at a constant temperature. The balance between the heat capacity of the shielding material, the energy emitted from the tested material and the flow rate of the shielding fluid will ensure a permanent temperature at the layer of the shielding fluid that has contact with the magnet and keeps the temperature equilibrium in the long run within a predetermined range of temperature fluctuation of the tested material, as long as the tested material does not exceed a certain temperature and as long as the time constant of the heat transfer of the shielding liquid is not interrupted, meaning the flow rate doesn't change.

The following are the parameters of the system that are interrelated and that keep the temperature equilibrium of the system.
 1. Shielding fluid heat capacity;
 2. Thickness of the layer of shielding fluid that surrounds the NMR probe;
 3. The temperature delta between the shielding fluid and the tested material;
 4. The flow rate of the tested material;
 5. The insulation constant of the various layers;
 6. The temperature drop at the heat exchanger; and/or
 7. The flow rate of the shielding fluid.

Elements 1-5 are fixed in a given assembly as a function of a given design. Elements 6 and 7 can be controlled in real-time, based on the actual performance and control of the closed loop required for a particular tested material. With proper sensors (temperature and flow rate) a computer controlled pump and heat exchanger can change the flow rate and heat exchange parameters to control for constant temperature, as described above.

Reference is made now to FIG. 1, schematically presenting the magnetic resonance device, 10, in cross section showing the position of a heated sample, 3, between two magnets, 1a and 1b. The temperature of said sample fluctuates between 85-120 degrees Celsius. In order to maintain the magnets, 1a and 1b, at constant temperature they are thermally insulated from the sample by passive insulating layers, 5a and 5b. Additionally the sample, 3, as well as the magnetic resonance probe, 4, is contained within an active shielding envelope, 2a and 2b, containing shielding fluid. The shielding fluid flows through the active shielding envelope as indicated by the arrows.

Figure 2:
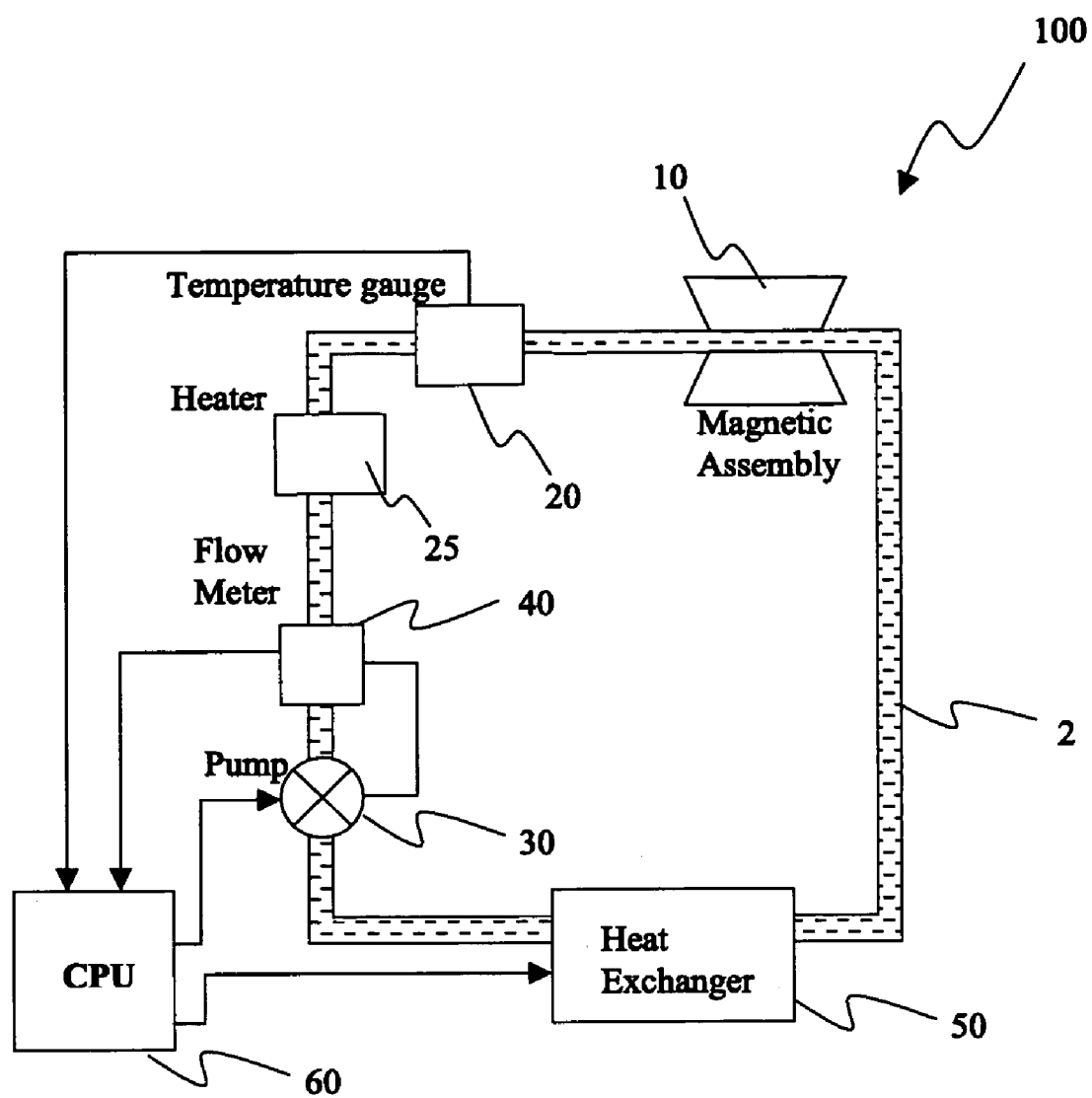
FIG. 2 schematically represents the closed loop active thermal shielding mechanism; and, FIG. 3 schematically represents the heat flow through the active thermal insulation envelope and how it can be manipulated in order to control the temperature of the magnetic assembly.

Reference is made now to FIG. 2, schematically presenting the closed loop active thermal shielding circuit, 100, comprising the magnetic resonance device, 10, a temperature gauge, 20, a flow meter, 40, pump, 30 and heat exchanger, 50. A central processing unit, 60, such as a computer, monitors the measurements of the temperature gauge and the flow meter and adjusts the flow rate and temperature of the shielding fluid using the pump and heat exchanger.

Figure 3:
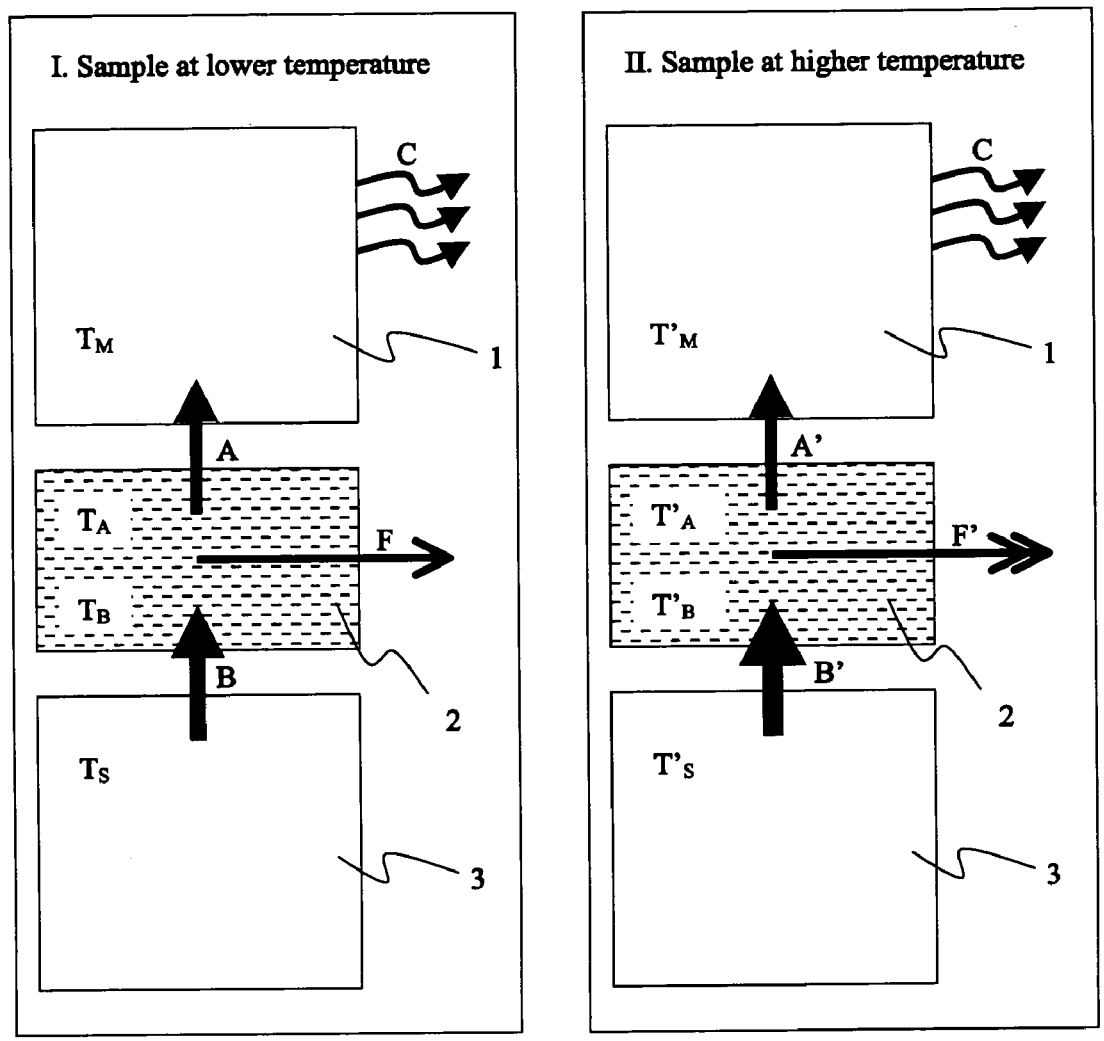

Reference is now made to FIG. 3, schematically representing the heat flow through the active thermal insulation envelope, 2, and how it can be manipulated in order to control the temperature of the magnetic assembly, 1.

In example I, the sample, 3, contained within the active thermal insulation envelope, 2, is at a temperature $T_S$, and of the magnetic assembly, 1, outside the active thermal insulation envelope is at a temperature $T_M$. When heat flowing from the active thermal insulation envelope to the magnetic assembly, as indicated by arrow A, exceeds the amount of heat dissipated by the magnetic assembly, as indicated by arrows C, the temperature of the magnetic assembly, $T_M$ will rise. The rate of heat flowing from the active thermal insulation envelope to the magnetic assembly, A, depends upon the difference between $T_M$ and the temperature of the external surface of the envelope, $T_A$. Heat flows from the sample to the shielding fluid as indicated by the arrow, B, the rate of this heat flow depends upon the difference between $T_S$ and the temperature of the internal surface of the envelope, $T_B$. The temperature of the outer surface of the envelope, $T_A$ depends upon a number of factors including the internal surface temperature $T_B$, the heat capacity of the shielding fluid, the thickness of the envelope, and the flow rate of the shielding fluid, indicated by the arrow F.

In example II, the temperature of the sample has increased i.e. $T'_S > T_S$. $T'_B$ may now increase as the rate of heat flow into the shielding fluid, B' is now greater than B. It is possible to reduce heat flow from the shielding fluid to the magnetic assembly by increasing the flow rate, F'. In this way the temperature of the magnetic assembly is maintained.

What is claimed is:

1. An active thermal insulation method comprising;
   a. providing a closed circuit of cooling fluid such as a CFC mixture;
   b. controlling the flow rate of said cooling-fluid through said closed-circuit;
   c. providing means, such as a heat exchanger, of removing the heat from said cooling-fluid;
   d. monitoring the temperature of said cooling-fluid by means of a temperature gauge;
   e. monitoring the temperature of said contained body;
   f. monitoring the temperature of said external body;
   g. monitoring the flow rate of said cooling-fluid using a flow meter;
   h. providing a control means, such as inter alia a digital computer, which receives data from said flow meters and temperature gauges, processes the data and sends control signals to the pump or the heat exchanger;
   wherein said temperature controlling provides an actively thermally insulated virtual envelope of constant temperature between said contained body and external body.

2. The active thermal insulation method, as outlined in claim 1, wherein controlling the heat flow from said thermally insulated envelope to said external body is carried out by increasing the flow rate of said cooling fluid, via a pump or any other means, when the temperature of the contained body increases and reducing the flow rate of said cooling fluid when the temperature of the contained body decreases.

3. The active thermal insulation method, as outlined in claim 1, comprising controlling said heat flow from said active thermally insulated envelope to said external body by increasing the temperature of said cooling fluid, especially by means of a heat exchanger when the temperature of the contained body decreases and decreasing the temperature of said cooling fluid, by means of a heat exchanger or any other means, when the temperature of the contained body increases.

4. The active thermal insulation method, as outlined in claim 1; comprising controlling the heat flow from said thermally insulated envelope to the external body by a combination of adjusting the temperature of the shielding fluid and its flow rate in response to changes in the temperature of either the contained body, external body or both.

5. An active thermal insulation system comprising;
   a. at least one closed circuit containing a cooling fluid such as a CFC mixture;
   b. at least one pump or any other means for controlling the flow rate of said cooling through a closed circuit;
   c. at least one heat exchanger or any other means of controlling the temperature of said cooling fluid flowing through said closed circuit;
   d. at least one means, such as inter alia a temperature gauge, thermometer, thermocouple, for measuring said temperature of said cooling fluid;
   e. at least one means, such as inter alia a temperature gauge, thermometer, thermocouple, for measuring the temperature of a contained body;
   f. at least one means, such as inter alia a temperature gauge, thermometer, thermocouple, for measuring the temperature of an external body;
   g. at least one means, such as inter alia a flow meter, for measuring the flow rate of said cooling fluid; and
   h. control means, such as inter alia a CPU, which receives data from said flow meters and temperature gauges, processes the data and sends control signals to said pump or the heat exchanger;
   wherein a thermally insulated virtual envelope is created between a contained body and an external body by controlling the amount of heat flow between said active thermally insulated envelope and said contained body as well as the amount of heat flowing between said active thermally insulated envelope and said external body.

6. An active insulation means, according to claim 5, wherein the external body is the magnetic assembly of a magnetic resonance measuring device, such as inter alia, an NMR or MRI, and the contained body is a sample being measured by said magnetic resonance measuring device.

* * * * *